(12) United States Patent
Romero et al.

(10) Patent No.: US 9,003,649 B1
(45) Date of Patent: Apr. 14, 2015

(54) METHOD OF MAKING A TWO-SIDED FLUID COOLED ASSEMBLY

(75) Inventors: Guillermo L. Romero, Phoenix, AZ (US); Joe L Martinez, Jr., Scottsdale, AZ (US)

(73) Assignee: Maxq Technology, LLC, Tempe, AZ (US)

( * ) Notice: Subject to any disclaimer, the term of this patent is extended or adjusted under 35 U.S.C. 154(b) by 315 days.

(21) Appl. No.: 13/357,783

(22) Filed: Jan. 25, 2012

Related U.S. Application Data

(63) Continuation-in-part of application No. 13/189,391, filed on Jul. 22, 2011, and a continuation-in-part of application No. 12/823,990, filed on Jun. 25, 2010, now abandoned.

(51) Int. Cl.
*H05K 3/36* (2006.01)
*B23K 20/12* (2006.01)

(52) U.S. Cl.
CPC .................................. *B23K 20/127* (2013.01)

(58) Field of Classification Search
CPC .. H05K 7/205; H05K 7/20927; H01L 23/473; F28D 9/0031
USPC .......... 29/830, 832, 824, 840, 558, 890.3, 84, 29/890.33; 165/80.4; 361/699
See application file for complete search history.

(56) References Cited

U.S. PATENT DOCUMENTS 4,879,891 A * 11/1989 Hinshaw .................... 29/890.03
6,588,647 B2 * 7/2003 Yamada et al. ............ 29/890.03
7,173,823 B1 * 2/2007 Rinehart et al. .............. 361/699

* cited by examiner

*Primary Examiner* — Donghai D Nguyen
(74) *Attorney, Agent, or Firm* — Timothy E. Siegel Patent Law, PLLC; Timothy E. Siegel (57) ABSTRACT

A fluid cooled electrical assembly that includes a metal box, having a bottom wall, side walls and a top wall. A set of straight-edged pins, each smaller than 3 mm across in widest dimension, extend down from the top wall and up from the bottom wall. Also, electrical components are mounted on top of the top wall and on bottom of the bottom wall.

9 Claims, 6 Drawing Sheets

METHOD OF MAKING A TWO-SIDED FLUID COOLED ASSEMBLY

RELATED APPLICATION

This application is a continuation-in-part of application Ser. No. 13/189,391, filed Jul. 22, 2011, which is a continuation-in-part of application Ser. No. 12/823,990, filed Jun. 25, 2010, now abandoned.

BACKGROUND

Liquid cooling of power electronics is an evolving science. One sort of cooling device used today is formed by casting or machining, by an end mill, an open metal box having protrusions rising from the floor. This box is then closed by welding on a lid, and is turned upside down so that electrical components can be attached to a surface supported by the bottom of what had been the floor. One problem with this technique is that the casting and milling techniques used do not permit the formation of a dense array of thin protrusions, which is most effective at transferring heat into a passing liquid.

In another prior art method, sintered copper is molded into a form having narrow pins extending from a planar portion. These pins are, by necessity round. Copper is softer and heavier than is ideally desirable, and rather expensive. A method of making a fluid cooled assembly having thin (less than 3 mm) pins of a harder, stronger and less expensive material is desirable.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In a first separate aspect, the present invention may take the form of a method of making a fluid cooled assembly that makes use of a work piece that forms a partial enclosure defining an interior void space and having a top wall having a top surface, and that has a bottom wall having a bottom surface, and that defines at least one top opening through the top wall to the void space and at least one bottom opening through the bottom wall to the void space. The work piece further defines fluid entrance and exit ports into the void space, the top wall and the bottom wall both being made of material that can be friction stir welded. The method also utilizes a top lid having a size and shape substantially conformal to the top opening, having a top surface that at least at the margins and which is formed of a material that can be friction stir welded to the work piece and a similarly constructed bottom lid. The top lid is placed into the top opening so that the top lid top surface is flush with the top surface of the work piece top wall and friction welding the top lid to the work piece and the bottom lid is placed into the bottom opening so that the bottom lid bottom surface is flush with the bottom surface of the work piece bottom wall and friction welding the bottom lid to the work piece.

In a second separate aspect, the present invention may take the form of a fluid cooled electrical assembly that includes a metal box, having a bottom wall, side walls and a top wall. A set of straight-edged pins, each smaller than 3 mm across in widest dimension, extend down from the top wall and up from the bottom wall. Also, electrical components are mounted on top of the top wall and on bottom of the bottom wall.

In a third separate aspect, the present invention may take the form of a fluid cooled electrical assembly that includes an aluminum alloy metal box, having a bottom wall, side walls and a top wall. A set of pins, each smaller than 3 mm across in widest dimension, extend down from the top wall and are unitary to and made of the same material as the top wall. Another set of similar pins extend up from the bottom wall and are unitary to and made of the same material as the bottom wall. Finally, electrical components are mounted on top of the top wall and on bottom of the bottom wall.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced drawings. It is intended that the embodiments and figures disclosed herein are to be considered illustrative rather than restrictive.

DETAILED DESCRIPTION OF THE PREFERRED EMBODIMENTS

Figure 1:
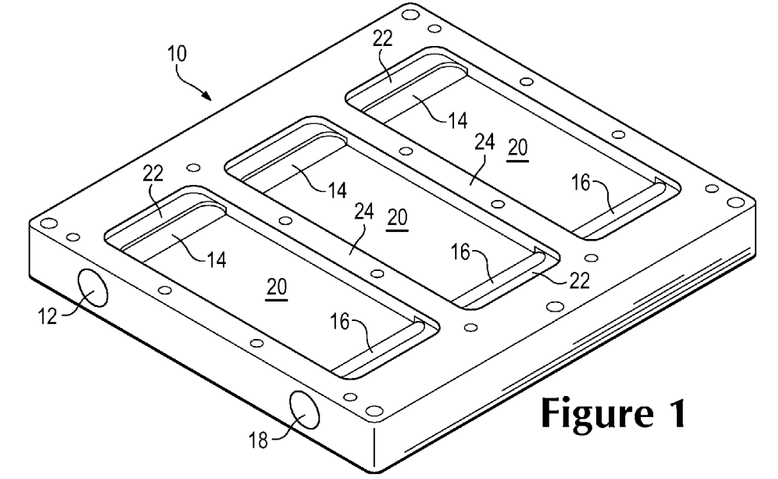
FIG. 1 is a perspective view of a work piece that is incorporated into a liquid cooled electrical apparatus, according to the present invention.

Referring to FIG. 1, in a preferred embodiment the construction of a liquid cooled assembly includes a work piece 10, having an inflow port 12 and inflow channel 14 and an outflow channel 16 and outflow port 18. In the finished assembly, to travel from channel 14 to channel 18, fluid must flow through one of three flow cavities 20. Each cavity has a pair of shelves 22 defined on either side. Cavities are separated by ribs 24.

Figure 2:
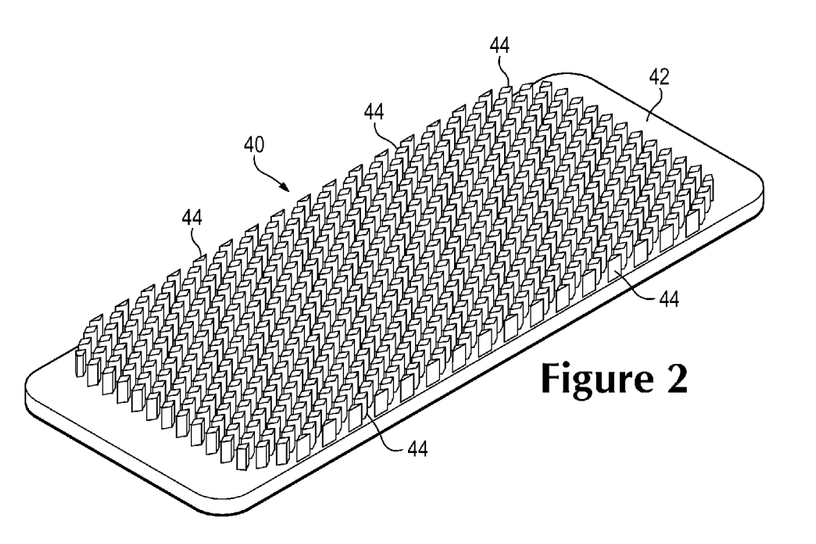
FIG. 2 is a perspective view of a lid that is placed into the work piece of FIG. 1, to form a liquid cooled electrical apparatus, according to the present invention.

Referring to FIG. 2, a lid 40 for work piece 10 includes a planar portion 42, which supports a number of downwardly extending pins 44. In one preferred embodiment these pins are formed by sawing into a work piece, which begins as a solid blank of an aluminum alloy. In one embodiment, this sawing is done using ganged saw blades, although it could be done using a single saw blade. In one preferred embodiment pins that are rectangular in cross-section and that have a width of about 0.8 mm to 3 mm are created.

Figure 3A:
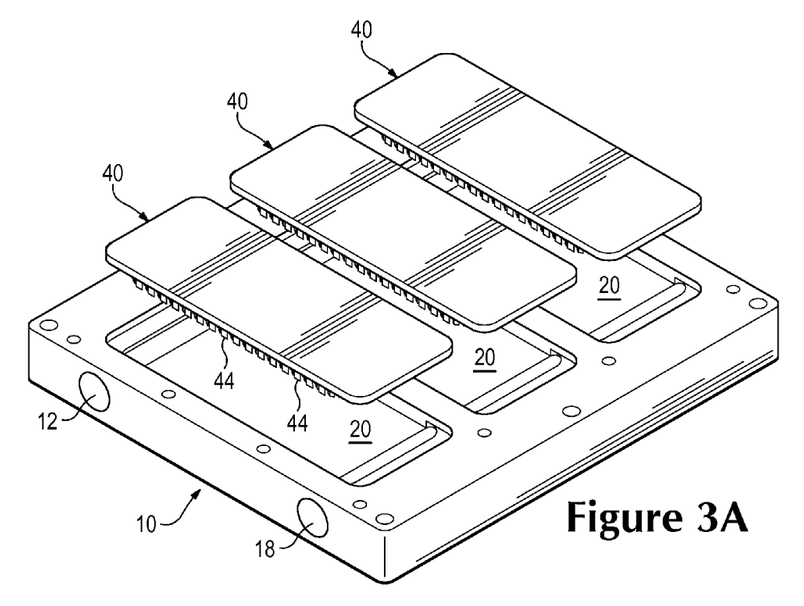
FIG. 3A is a perspective view of a step in the manufacturing process of liquid cooled electrical apparatus of the present invention, showing the lids of FIG. 2 positioned so as to be fit into the openings of the work piece of FIG. 1.
Figure 3B:
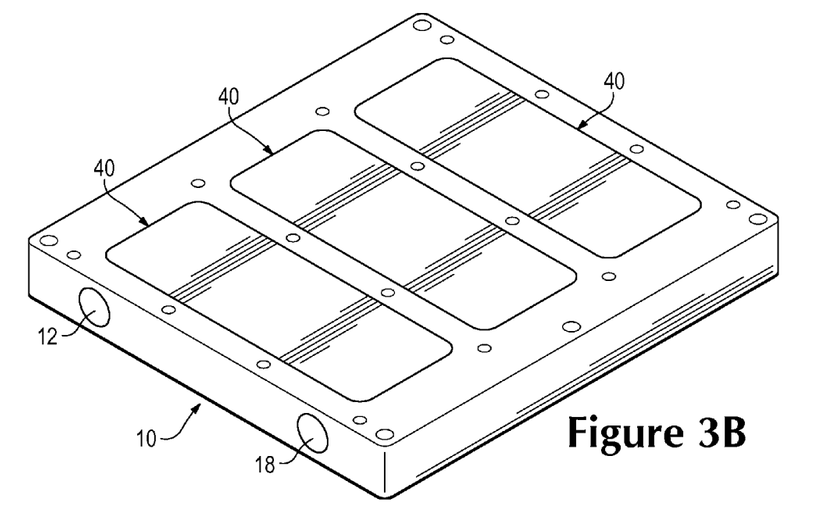
FIG. 3B is a perspective view of a liquid cooled assembly of the present invention after the lids of FIG. 2 have been fit in, but before any electrical components have been added.

Referring to FIGS. 3A and 3B, lids 40 are placed on shelves 22 and friction stir welded to work piece 10, to cap the flow cavities 20. The top of lids 40 and ribs of work piece 10 form a supporting surface for an electrical assembly needing cooling.

Figure 4:
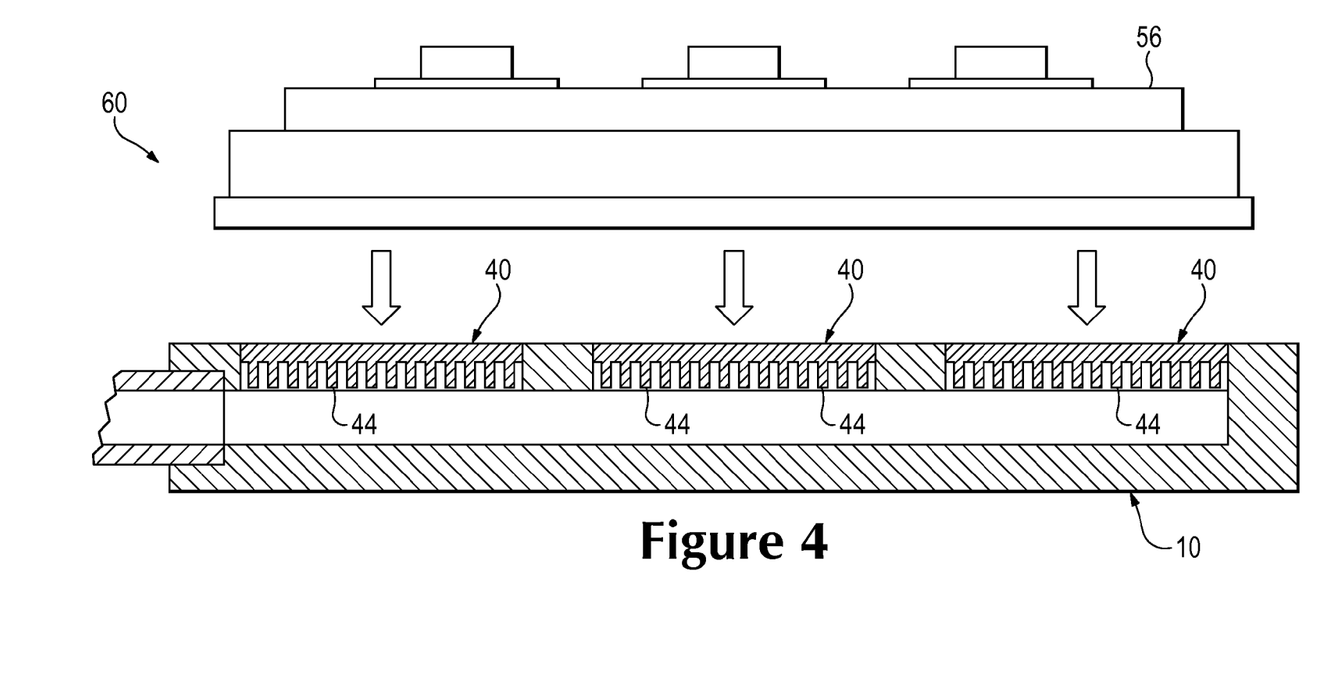
FIG. 4 is a side view of a power module being placed on the work piece shown in FIG. 3B, to form a final liquid cooled module.
Figure 5:
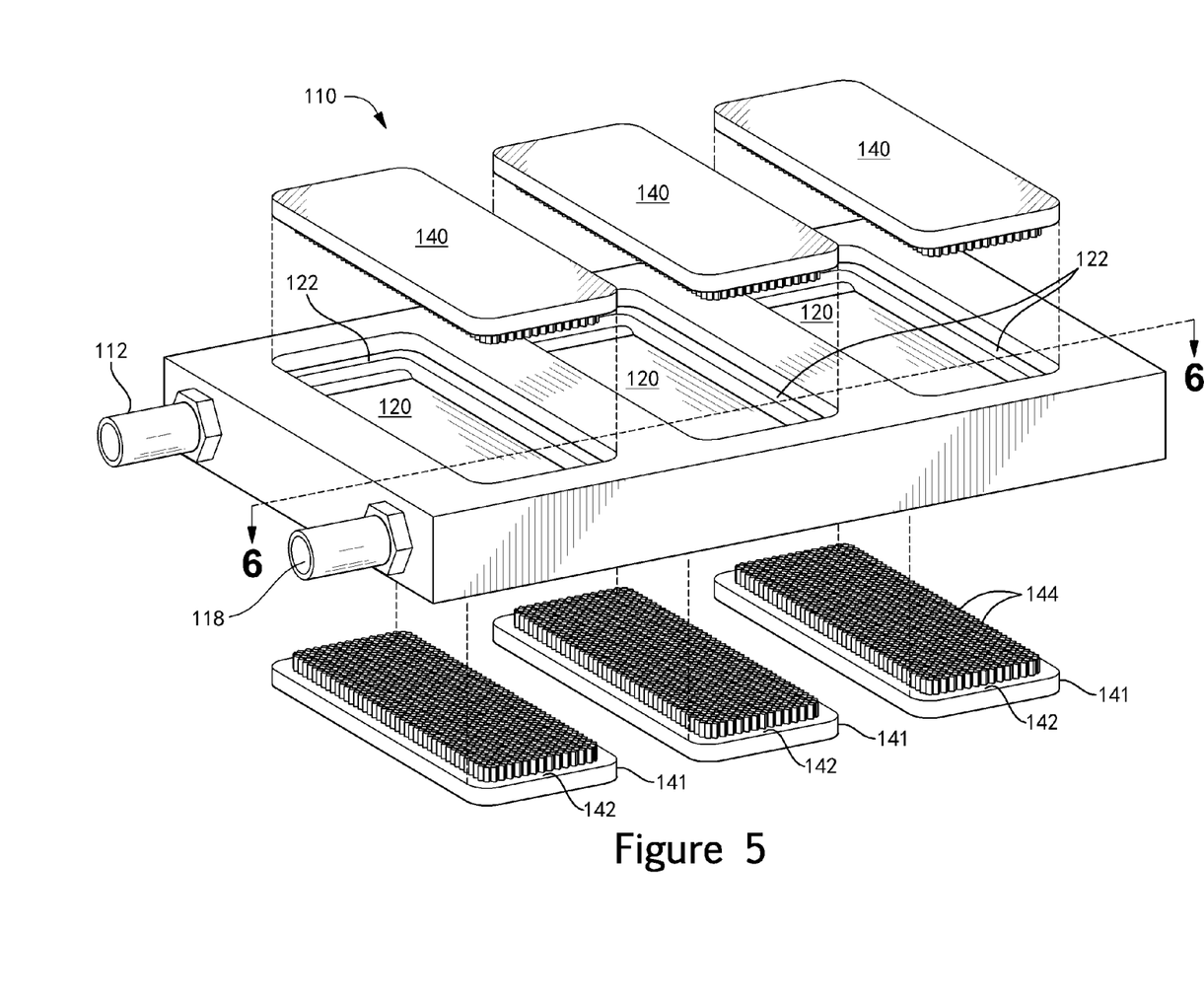
FIG. 5 is an exploded perspective view of a two-sided cooling assembly, according to the present invention.
Figure 6:
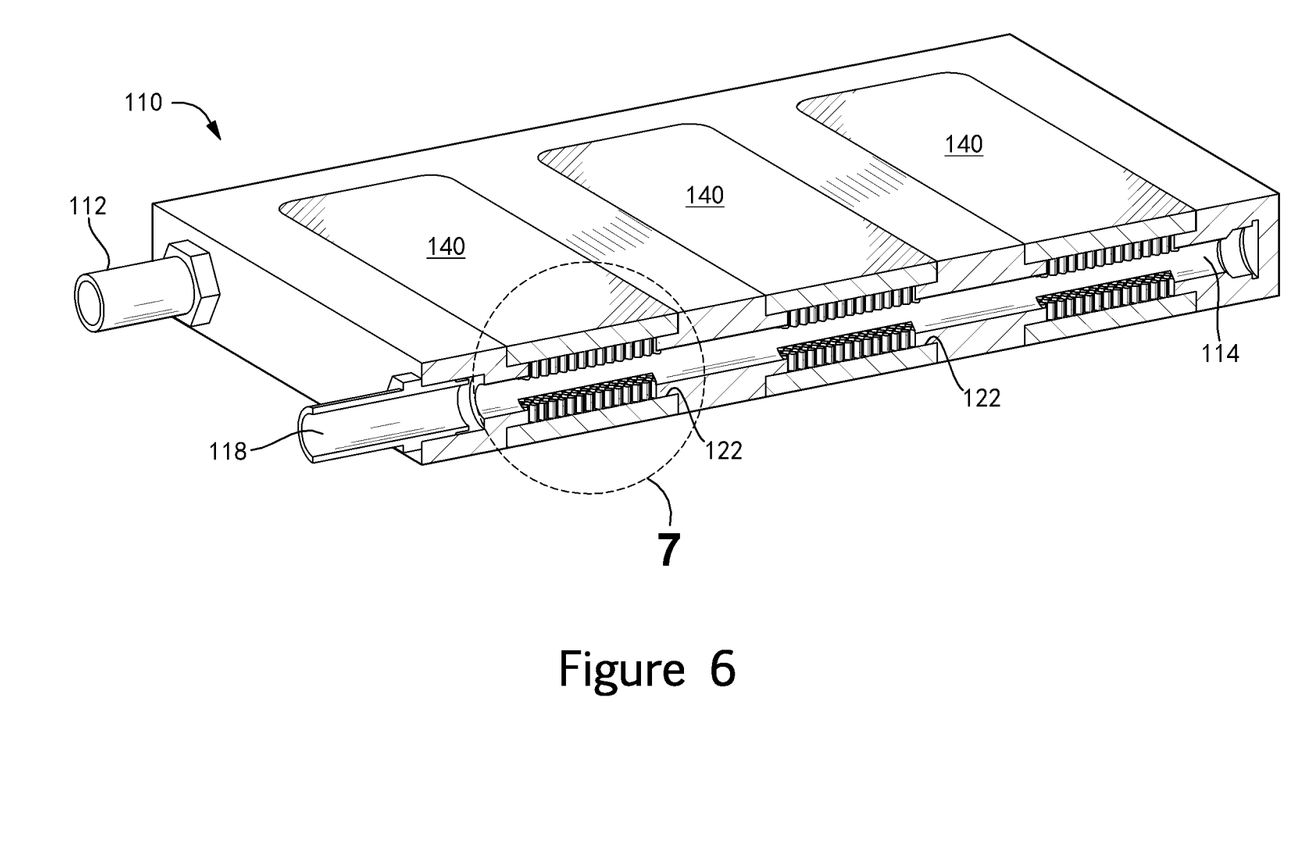
FIG. 6 is a sectional view of the cooling assembly of FIG. 5, taken along line 6-6 of FIG. 5.
Figure 7:
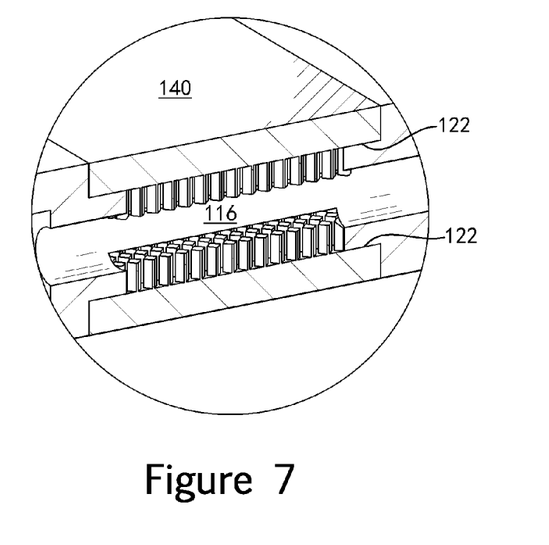
FIG. 7 is a detail view of a portion of the assembly of FIG. 5, indicated by circle 7.

FIG. 4 shows an electrical power module 56 being placed onto work piece 10, to form a final assembly 60. The result is a robust metal structure having excellent cooling characteristics. Comparable prior art structures were formed by using an end mill to machine pins into the bottom of a work piece similar to 10, and then flipping the assembly upside-down and placing the electrical assembly on this surface. The formation of the pins was hampered by the side walls of the work piece. But in the method of the present invention, the lids 40 do not have comparable side walls, and the metal can be sawn through entirely, from side-to-side, thereby forming a superior array of smaller pins, better suited to carrying heat from the top of each lid 40 into a passing liquid, such as water.

Moreover, the final assembly 50, is made of an aluminum alloy that is hard and strong. In one preferred embodiment aluminum alloy 6061 is used. For the purposes of this application, pure aluminum is considered to be an aluminum alloy. In an alternative preferred embodiment, copper or a copper alloy is used.

The above noted materials, however, have a greater coefficient of thermal expansion than the typical power module 56 that would be mounted on the top of assembly 10. Accordingly, in some embodiments it is advisable to use conductive grease between assembly 10 and module 56.

To achieve a more direct bond, however, the work pieces 10 used to make lids 40 are formed by casting molten aluminum alloy (for example alloy 6061) into a mold having a preformed mesh of silicon carbide, 0.25 to 1 mm high, covering most of the bottom but leaving a circumferential margin, of about 6 mm width, empty. When the molten alloy material fills the mold, it fills the many gaps in the silicon carbide mesh, forming a metal matrix composite (MMC). After removal from the mold, the side opposite the MMC is sawed to form pins 44, and the lid 40 is flipped over, so that the aluminum filled silicon carbide mesh is on the top, opposite from pins 44. A circumferential margin, however, does not have the silicon carbide mesh as part of the structure. Alternatively, lids 40 can be made of an aluminum silicon alloy, which can be friction stir welded, and which has desirable thermal expansion characteristics. In one preferred embodiment an aluminum silicon alloy produced by powder metallurgy is used, and contains 40% silicon and 60% aluminum.

The aluminum filled silicon carbide mesh portion has a lower coefficient of thermal expansion, depending on the percentage of silicon carbide, than the aluminum alloy, but is also integral to the aluminum alloy that is not intertwined with the silicon carbide. Accordingly, the top of lid 40 (other than the approximately 6 mm circumferential margin) has a coefficient of thermal expansion between 10 and 18 ppm/° C., which is closer to that of power module 56 than is aluminum, so as to make direct soldering practical, by avoiding a degree of thermal mismatch that would destroy the direct solder bond after only a few thermal cycles. Lid 40 as a whole has higher thermal conductivity and is mostly made of a material that is softer and therefore more easily machined.

Another embodiment whereby the top surface of the lid 40 can have a lower coefficient of expansion is to use what is known as Cold Spray Technology to spray a layer of a different metal (such as copper, or a copper tungsten alloy) up to 0.2 mm thick, on a portion of lid 40, after assembly 10 has been fabricated so as to effectively reduce the thermal expansion of the top surface of lid 40, thereby making direct soldering of power module 56 practical, in like manner to the process described in the above paragraph.

Figure 8:
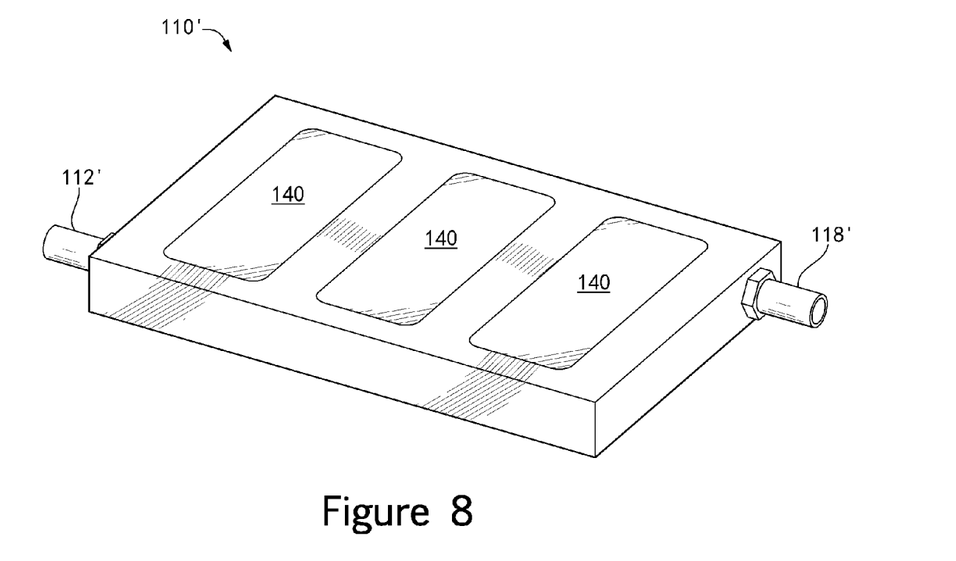
FIG. 8 is a perspective view of an alternative embodiment of a two-sided cooling assembly according to the present invention.

Referring to FIGS. 4-7, in an alternative preferred embodiment, a two-sided fluid cooled embodiment 110 includes an inflow port 112 and an outflow port 118. Fluid passageways 116 permit fluid flow through flow cavities 120, which and thereby from inflow port 112 to outflow port 118. For each flow cavity, embodiment 110 an upper circumferential seat 122 and a lower circumferential shelf (not shown) to accommodate the placement of a top lid 140 and a bottom lid 141. Lids 140 and 141 all define a ledge 142 to fit onto seat 122 and a set of pins 144. Lids 140 and 142, including pins 144, are formed and sealed onto work piece 110 as described above with respect to the one sided embodiments. FIG. 8 shows an alternative embodiment 110' in which an inflow port 112' is located kitty corner from outflow port 118'.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A method of making a fluid cooled assembly, comprising:
   (a) providing a work piece that forms a partial enclosure defining an interior void space and having a top wall having a top surface, and that has a bottom wall having a bottom surface, and that defines at least one top opening through said top wall to said void space, said work piece further having a pair of opposed ledges between said top opening and said void space said work piece further defining fluid entrance and exit ports into said void space, said top wall and said bottom wall both being made of material that can be friction stir welded;
   (b) providing a top lid having a size and shape substantially conformal to said top opening, having a top surface that at least at the margins, is formed of a material that can be friction stir welded to said work piece, and having a bottom surface that has a set of heat sink protrusions extending downwardly but has a pair of opposed regions matching said opposed ledges, which are free of heat sink protrusions; and
   (d) placing said top lid into said top opening so that said opposed regions are set onto said ledges thereby placing said top lid top surface flush with said top surface of said work piece top wall and friction welding said top lid to said work piece.

2. The method of claim 1, wherein said openings are defined by edges that taper outwardly from bottom to top and wherein said lid has a matching downwardly facing surfaces so that when said lid is placed on said opening it is supported in position with said top surface of said lid flush to said top surface of said compartment top wall.

3. The method of claim 1, wherein said lids are formed by providing lid work pieces having a prospectively interior surface and sawing into each said interior surface to form a set of pins.

4. The method of claim 3, wherein said sawing is performed by saw blades that are ganged together.

5. The method of claim 1, further including the step of attaching electric components to said upper surface of said top lid and onto said bottom surface of said bottom lid.

6. The method of claim 1, wherein said work piece defines at least one additional top opening and wherein at least one further top lid is installed.

7. The method of claim 1, further wherein:
   (a) said work piece defines a bottom opening said work piece further having a pair of opposed ledges between said bottom opening and said void space; and
   (b) providing a bottom lid having a size and shape substantially conformal to said bottom opening, having a bottom surface that at least at the margins, is formed of a material that can be friction stir welded to said work piece, and having a top surface that has a set of heat sink protrusions extending upwardly but has a pair of opposed regions matching said opposed ledges, which are free of heat sink protrusions; and
   (c) placing said bottom lid into said bottom opening so that said opposed regions are set onto said ledges thereby placing said bottom lid bottom surface flush with said bottom surface of said work piece bottom wall and friction welding said bottom lid to said work piece.

8. The method of claim 1, wherein said lid is made of an aluminum silicon alloy.

9. The method of claim 1 wherein said opposed ledges form a part of a circumferential ledge, extending around said opening and said opposed regions form a part of a circumferential region without heat sink protrusions matching said circumferential ledge.

* * * * *

UNITED STATES PATENT AND TRADEMARK OFFICE
CERTIFICATE OF CORRECTION

| | |
|---|---|
| PATENT NO. | : 9,003,649 B1 |
| APPLICATION NO. | : 13/357783 |
| DATED | : April 14, 2015 |
| INVENTOR(S) | : Guillermo L. Romero and Joe L. Martinez |

It is certified that error appears in the above-identified patent and that said Letters Patent is hereby corrected as shown below:

In the Claims:

In Column 4, line 55, in Claim 2, please delete the word "a".

Signed and Sealed this
Twenty-sixth Day of July, 2016

Michelle K. Lee
*Director of the United States Patent and Trademark Office*